(12) United States Patent
Ikeda

(10) Patent No.: US 6,791,866 B2
(45) Date of Patent: Sep. 14, 2004

(54) MAGNETORESISTIVE FILM, METHOD OF MANUFACTURING MAGNETORESISTIVE FILM, AND MEMORY USING MAGNETORESISTIVE FILM

(75) Inventor: Takashi Ikeda, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/259,623

(22) Filed: Sep. 30, 2002

(65) Prior Publication Data
US 2003/0063491 A1 Apr. 3, 2003

(30) Foreign Application Priority Data
Oct. 1, 2001 (JP) .......................... 2001-305068

(51) Int. Cl.⁷ .............................................. G11C 11/00
(52) U.S. Cl. ...................... 365/158; 365/171; 257/295; 438/3
(58) Field of Search ................. 365/158, 171; 257/295; 438/3

(56) References Cited

U.S. PATENT DOCUMENTS

| | | | |
|---|---|---|---|
| 6,219,275 B1 | 4/2001 | Nishimura | 365/173 |
| 6,324,127 B1 * | 11/2001 | Kim | 369/13.45 |
| 6,628,542 B2 * | 9/2003 | Hayashi et al. | 365/158 |
| 6,661,703 B1 * | 12/2003 | Ikeda | 365/158 |

FOREIGN PATENT DOCUMENTS

| | | |
|---|---|---|
| EP | 1045403 | 10/2000 |
| JP | 2000-306374 | 11/2000 |

* cited by examiner

Primary Examiner—Richard Elms
Assistant Examiner—Toan Le
(74) Attorney, Agent, or Firm—Fitzpatrick, Cella, Harper & Scinto

(57) ABSTRACT

A magnetoresistive film having a relatively large magnetoresistive effect includes a ferrimagnetic layer, a magnetic layer, and a tunneling barrier layer disposed between the ferrimagnetic layer and the magnetic layer, the ferrimagnetic layer whose major composition including a rare earth metal and a transition metal, the magnetoresistive film including
oxidized are rare earth metal that exists near an interface between the ferrimagnetic layer and the tunneling barrier layer.

10 Claims, 4 Drawing Sheets

MAGNETORESISTIVE FILM, METHOD OF MANUFACTURING MAGNETORESISTIVE FILM, AND MEMORY USING MAGNETORESISTIVE FILM

BACKGROUND OF THE INVENTION

1. Field of the Invention

The present invention relates to a magnetoresistive film made of a ferrimagnetic material whose major constituents are a rare earth metal and a transition metal, and more particularly to a magnetoresistive film that exhibits a relatively large magnetoresistive effect, a method of manufacturing the magnetoresistive film, and a memory that uses such a magnetoresistive film.

2. Related Background Art

In recent years, a semiconductor memory which is a solid state memory has been used extensively in information equipment. Semiconductor memories are in variety of types and include DRAMs, (dynamic random access memory), FeRAMs (ferroelectrics random access memory), and flash EEPROM (electrically erasable programmable read only memory). These semiconductor memories have advantages and disadvantages. No one type of semiconductor memory meets all requirements of information equipment in current use. For example, DRAMs have a high recording density and can be rewritten a large number of times. However, DRAMs are volatile, so that when the memory is turned off, the stored information is lost. Flash EEPROMs are non-volatile but take a long time for erasing information and therefore do not lend themselves to the high-speed processing of information.

In contrast to semiconductor memories, a memory based on magnetoresistive effect (MRAM: magnetic random access memory) is non-volatile and a potential material that will meet all the requirements of current information equipment including write time, read time, recording density, the number of times that information can be rewritten, and power consumption. Especially, an MRAM using a spin dependent tunnel magnetoresistance (TMR) provides a large read signal and is therefore advantageous in designing a memory of high recording density or high-speed reading. Recent researches showed the feasibility of a memory using the MRAM.

A basic configuration of a magnetoresistive film used as an MRAM element is a sandwich structure in which a non-magnetic layer is sandwiched between magnetic layers. Materials as the non-magnetic layer include, for example, Cu and $Al_2O_3$. A magnetoresistive film using, for example, Cu as a non-magnetic layer is referred to as GMR (giant magneto-resistance) film while a magnetoresistive film based on insulators such as $Al_2O_3$ is referred to as a spin dependent tunnel magnetoresistive (TMR) film. Typically, TMR films have larger magnetoresistances than GMR films.

FIGS. 6A and 6B illustrate a magnetoresistive film of a configuration where two magnetic layers are laminated with a non-magnetic layer sandwiched therebetween. Arrows indicate the direction of magnetization of the respective magnetic layers. As shown in FIG. 6A, if the magnetization directions of the two magnetic layers are oriented parallel, the electrical resistance (electrical resistance between the two magnetic layers) of the magnetoresistive film is relatively low. If the directions of magnetization are anti-parallel as shown in FIG. 6B, the electrical resistance is relatively high. Thus, by using one of the two magnetic layers as a memory layer and the other as a detecting layer and making use of the aforementioned property, reading information can be accomplished. For example, a magnetic layer 13 located on a non-magnetic layer 12 operates as a memory layer and a magnetic layer 11 under the non-magnetic layer 12 operates as a detecting layer. The information stored is assumed to be "1" when the magnetization direction of the memory layer (magnetic layer 13) is rightward and "0" when the magnetization direction is leftward.

If the magnetization directions of the magnetic layers 11 and 13 are both rightward as shown in FIG. 7A, the electrical resistance of the magnetoresistive film is relatively low. If the magnetization direction of the magnetic layer 11 is rightward and the magnetization direction of the magnetic layer 13 is leftward as shown in FIG. 7B, the electrical resistance of the magnetoresistive film is relatively high. Likewise, if the magnetization direction of the magnetic layer 11 is leftward and the magnetization direction of the magnetic layer 13 is rightward as shown in FIG. 7C, the electrical resistance of the magnetoresistive film is relatively high. If the magnetization directions of the magnetic layers 11 and 13 are both leftward as shown in FIG. 7D, the electrical resistance of the magnetoresistive film is relatively low. When the magnetization direction of the detecting layer 11 is rightward, a relatively high electrical resistance indicates that the memory layer 13 holds "0" and a relatively low electrical resistance indicates that the memory layer 13 holds "1". Alternatively, when the magnetization direction of the detecting layer 11 is leftward, a relatively high electrical resistance indicates that the memory layer 13 holds "1" and a relatively low electrical resistance indicates that the memory layer 13 holds "0".

Thus, the constituents of the magnetic layers 11 and 13 are selected such that the detecting layer 11 has a relatively large coercive force and the memory layer 13 has a relatively small coercive force. Information can be written by magnetizing the detecting layer 11 in one direction and applying a magnetic field to the memory layer 13 in such a way that the memory 13 is changed in the direction of magnetization but the detecting layer 11 is not reversed in the direction of magnetization. Information can be read by detecting the electrical resistance of the magnetoresistive film.

MRAMs use a surface magnetization film as a magnetic layer. If the size of the magnetoresistive film is made smaller in an attempt to increase the recording density of MRAM, the magnetoresistive film cannot hold information because of the demagnetizing field or curling of magnetization of the end surface of the element. One way of avoiding this problem, for example, is to make the magnetic layer rectangular. However, this approach cannot increase the recording density significantly because the element size cannot be smaller.

As described in, for example, U.S. Pat. No. 6,219,275, the Applicant of the present invention has proposed the use of a vertically magnetizing film to solve the aforementioned problem. The use of the vertically magnetizing film will not increase the demagnetizing field even if the element size is made smaller. Thus, the use of a vertically magnetizing film can implement a magnetoresistive film having a smaller size than a MRAM that uses a surface magnetizing film.

Just as in a magnetoresistive film using a surface magnetizing film, a magnetoresistive film using a vertically magnetizing film exhibits a relatively low resistance if the two magnetic layers are magnetized in parallel directions, and a relatively high resistance if the two magnetic layers are magnetized in anti-parallel directions. The magnetic layer 23 formed on the non-magnetic layer 22 is used as a memory layer and the magnetic layer 21 formed under the non-magnetic layer 22 is used as a detecting layer. The information stored in the magnetoresistive film is assumed to be "1" if the memory layer 23 is magnetized upward and "0" if the memory layer 23 is magnetized downward. When the magnetic layers 21 and 23 are both magnetized upward as shown in FIG. 8A, the electrical resistance of the magnetoresistive film is relatively low. When the detecting layer 21 is magnetized downward and the memory layer 23 is magnetized upward as shown in FIG. 8C, the electrical resistance of the magnetoresistive film is relatively high. Likewise, when the detecting layer 21 is magnetized upward and the memory layer 23 is magnetized downward as shown in FIG. 8B, the electrical resistance of the magnetoresistive film is relatively high, and when both the magnetic layers 21 and 23 are magnetized downward as shown in FIG. 8D, the electrical resistance is relatively low. In other words, when the detecting layer 21 is magnetized upward, a relatively high electrical resistance indicates that the memory layer 23 holds "0" and a relatively low electrical resistance indicates that the memory layer 23 holds "1". Alternatively, when the detecting layer 21 is magnetized downward, a relatively high electrical resistance indicates that the memory layer 23 holds "1", and a relatively low electrical resistance indicates that the memory layer 23 holds information "0".

The vertically magnetizing film used in the aforementioned magnetoresistive element includes a film of alloy made of at least one element selected from rare earth metals such as Gd, Dy, Tb and at least one element selected from transition metals such as Co, Fe, and Ni, an artificial lattice film, a film of alloy made of transition metals such as Co/Pt and a precious metal, and a film of alloy of CoCr having a magneto-crystalline anisotropy in a direction perpendicular to the film surface. The film of alloy of rare earth metal and transition metal is a magnetoresistive film most suitable for a memory because it provides a magnetization curve having a rectangular ratio of 1, abrupt magnetic inversion when a magnetic field is applied to the film, and ease of manufacture.

The magnetoresistance ratio of a magnetoresistive film highly depends on the material in contact with a non-magnetic layer (tunneling barrier layer). It has been known from the past researches that Fe, Co, or alloys of Fe and Co exhibit large magnetoresistance ratios. However, the inventors of the present invention found that the magnetoresistive film shows a smaller magnetoresistance ratio when the magnetic material in contact with the non-magnetic layer is formed of a rare earth metal and a transition metal than when the magnetic material is formed of Fe, Co, or an alloy of Fe and Co. This can be due to the rare earth metal being adjacent the non-magnetoresisitive film. In other words, this can be to the fact that the atomic structure of rare earth metals in an alloy does not allow the rare earth metals to contribute to magnetoresistive effect and the electrons that conduct the atoms of rare earth metals existing in the interface between the tunnel barrier layer does not perform spin dependent tunneling.

The present invention was made in view of these drawbacks. An object of the invention is to provide a magnetoresistive film that uses a ferrimagnetic material whose major constituents are a rare earth metal and a transition metal and which exhibits a relatively large magnetoresistive effect. An object of the invention is to provide a method of manufacturing a magnetoresistive film, and a memory that uses such magnetoresistive films.

SUMMARY OF THE INVENTION

The magnetoresistive film according to the present invention is characterized in that the magnetoresistive film has first and second magnetic layers, a tunnel barrier layer sandwiched between the first and second magnetic layers, at least one of the first and second magnetic layers being a ferrimagnetic layer whose main constituents are a rare earth metal and a transition metal. A rare earth metal existing near the interface between the ferrimagnetic layer and the tunnel barrier layer is oxidized.

Rare earth metals such as Gd, Dy, and Tb are apt to be oxidized, and the oxides of these metals exhibit a higher electric resistivity than their non-oxidized atoms. Therefore, oxidizing a rare earth metal near the interface between the tunnel barrier layer and the ferrimagnetic layer will increase the magnetoresistive ratio effectively.

In the present invention, "a ferrimagnetic layer whose major constituents are a rare earth metal and a transition metal" refers to a magnetic layer that is primarily formed of a rare earth and a transition metal other than a rare earth metal and exhibits ferrimagnetism. The rare earth metal advantageously used in the invention is at least one element selected from the group of Gd, Dy, and Tb. The transition metal (other than rare earth metal) advantageously used in the invention is at least one element selected from iron group metals i.e., Fe, Co, and Ni.

The followings are methods of manufacturing magnetoresistive film.

A ferrimagnetic layer whose major constituents are a rare earth and a transition metal is formed, and then a tunneling barrier layer is formed on the ferrimagnetic layer. Then, the surface of the tunneling barrier layer is subjected to an oxidation treatment, thereby selectively oxidizing the atoms of a rare earth metal material of the ferrimagnetic layer that exists near the interface between the tunneling barrier layer. Rare earth metals are apt to be oxidized more easily than transition metals such as Fe, Co, and Ni. Thus, if an alloy of a rare earth metal and a transition metal is subjected to oxidation, the rare earth metal is selectively oxidized. Techniques of oxidation include, for example, plasma oxidation and natural oxidation. Any oxidation technique can be used. The tunneling barrier layer may not necessarily be formed after the ferrimagnetic layer is formed. For example, a material e.g., Al which can be a tunneling barrier layer through oxidation treatment may be formed and then the structure is subjected to oxidation where the selective oxidation of the rare earth metal and the formation of the tunneling barrier layer are performed simultaneously. Moreover, in order to oxidize the atoms of rare earth metal, the surface of the ferrimagnetic layer is subjected to oxidation before the tunneling barrier layer is formed and then the tunneling barrier layer may be formed.

DESCRIPTION OF THE PREFERRED EMBODIMENTS

Figure 1:
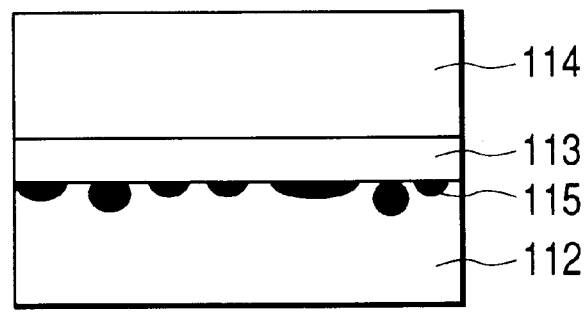
FIG. 1 is a cross-sectional view of a model representation of a magnetoresistive film according to an embodiment of the invention.

An embodiment of the invention will be described with respect to the drawings. FIG. 1 is a cross-sectional view, illustrating a model representation of a magnetoresistive film according to the embodiment.

FIG. 1 illustrates a configuration of a magnetoresistive film wherein a tunneling barrier layer 113 is sandwiched between an upper magnetic layer 114 and a lower ferrimagnetic layer 112. The ferrimagnetic layer 112 made of a ferrimagnetic material whose major constituents are a rare earth metal and a transition metal. The atoms of rare earth metal in the ferrimagnetic layer 112 existing near the interface between the ferrimagnetic layer 112 and the tunneling barrier layer 113 are oxidized into a layer region 115. Because the oxides of rare earth metal have high electrical resistances as compared with ordinary metals, a portion at which the tunneling barrier layer 113 and the layer region 115 are in contact with each other can be assumed as if it has an increased thickness. Thus, it can be assumed that only the atoms of the transition metal are substantially in contact with the tunneling barrier layer and play a role of a conductor. Thus, the electrons pass through the tunneling barrier layer 113 depending on the atoms in the spin state of the transition metal, so that the magnetoresistive ratio becomes larger than when the non-oxidized rare earth metal is in contact with the tunneling barrier layer 113.

The layer region 115 where the rare earth metal is oxidized may be formed uniformly at the interface between the ferrimagnetic layer 112 and the tunneling barrier layer 113. Alternatively, the layer region 115 may be formed in the shape of islands or a net as shown in FIG. 1. The layer region 115 may be formed by performing oxidation treatment on the surface of the ferrimagnetic layer 112 after forming the ferrimagnetic layer 112 but before forming the tunneling barrier layer 113. Alternatively, the layer region 115 may be formed by performing oxidation treatment from the surface of the tunneling barrier layer 113 after forming the ferrimagnetic layer 112 and the tunneling barrier layer 113 in sequence, so that the rare earth metal of the ferrimagnetic layer 112 near the interface adjacent to the tunneling barrier layer 113 is oxidized.

The ferrimagnetic layer 112 is preferably formed of an alloy whose major constituents are at least one element selected from rare earth metals such as Gd, Dy, Tb and at least one element selected from transition metals such as Co, Fe, and Ni. The ferrimagnetic layer 112 may be either of surface magnetization film and the vertically magnetizing film. Any of surface magnetization film and the vertically magnetizing film provides substantially the same advantages.

The example shown in FIG. 1 has been described with respect to a case where the magnetic layer located under the tunneling barrier layer 113 is a ferrimagnetic layer. In the invention, the magnetic layers on both sides of the tunneling barrier layer 113 may be a ferrimagnetic layer and a rare earth metal may be oxidized near the interface between the ferrimagnetic layer and the tunneling layer 113.

By forming a magnetic body having a larger spin polarization than the ferrimagnetic layer 112 at the interface between the ferrimagnetic layer 112 and the tunneling barrier layer 113, a larger magnetoresistance ratio can be obtained. The shape of a magnetic body having a large spin polarization may be any one of a film, an island, and a net. For any of these shapes, a relatively large magnetoresistance ratio can be obtained.

A memory having a large read signal can be implemented by making memory elements with a magnetoresistive film of the present invention, employing two means: means for recording information in a magnetoresistive film as a memory element and means for reading information recorded in the magnetoresistive film. A magnetic field produced by running current in a wire may be advantageously used as the means for recording information. A circuit that detects the voltage across the memory element when a predetermined current is run may be advantageously used as means for reading information stored in the memory element.

EXAMPLES

A magnetoresistive film according to the present invention will be described in more detail by way of examples.

First Example

Figure 2:
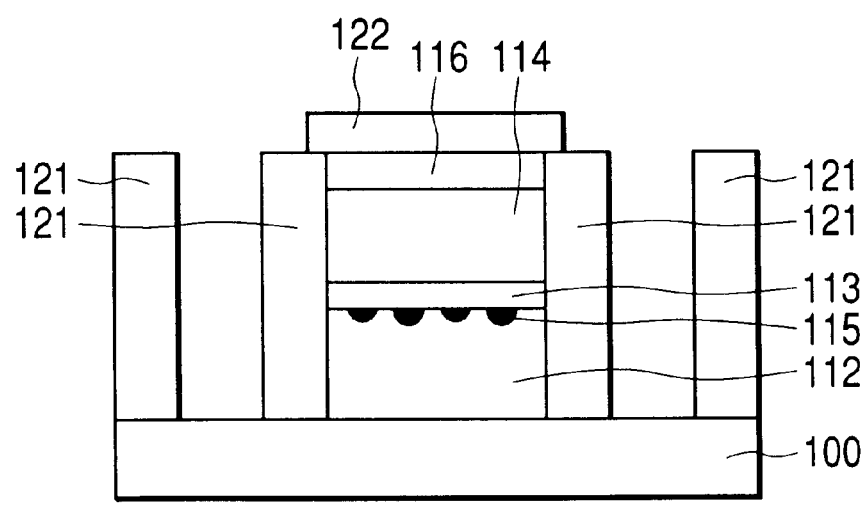
FIG. 2 is a cross-sectional view of a magnetoresistive film according to a first example.

FIG. 2 is a cross-sectional view of a magnetoresistive film according to a first example. An Si (silicone) substrate 100 is used to form a magnetoresistive film. Sequentially formed by sputtering on the Si substrate 100 are a $Gd_{20}(Fe_{60}Co_{40})_{80}$ film having a film thickness of 10 nm that serves as a ferrimagnetic layer 112, and an $Al_2O_3$ (aluminum oxide) film having a film thickness of 1.5 nm that serves as a tunneling barrier 113. Then, an oxygen gas is introduced into the vacuum chamber to perform plasma oxidation on the surface (i.e., the interface of the ferrimagnetic layer 112 on the side of the tunneling barrier layer 113) of the ferrimagnetic layer 112 through the surface of the $Al_2O_3$ film, thereby causing an interface of the ferrimagnetic layer on the side of the tunneling barrier layer 113 to be oxidized so that an oxidized layer 115 of the rare earth metal is formed. A power of 5 W was supplied during the plasma oxidation performed for 40 seconds. Then, the chamber was evacuated sufficiently, and sputtering was performed to form a $Tb_{20}(Fe_{50}Co_{50})_{80}$ film having a film thickness of 10 nm as the magnetic layer 114 and a Pt film having a film thickness of 2 nm as a protection film 116. The Pt film serves to prevent corrosion such as oxidation of the respective magnetic layers.

A resist film of 1 µm square is formed on the thus manufactured multi-layer film and portions of the magnetoresistive film not covered by the resist was removed by dry etching. After etching, an $Al_2O_3$ film having a film thickness of 25 nm is formed and then the resist and the $Al_2O_3$ on the resist are removed. Then, an insulation film 121 is formed for electrical isolation between the upper electrode and the ferrimagnetic layer 112 ($Gd_{20}(Fe_{60}Co_{40})_{80}$ film). Thereafter, the upper electrode 122 is formed using an Al film by a lift-off technique and a portion of the $Al_2O_3$ film not covered with the upper electrode 122 is removed to form an electrode pad that serves to connect the measuring circuit.

A predetermined amount of current is run through the thus formed magnetoresistive film by connecting a constant current source across the upper electrode 122 and the lower electrode (Si substrate 100), so that electrons tunnel through the tunneling barrier layer 113 ($Al_2O_3$ film) between the ferrimagnetic layer 112 ($Gd_{20}(Fe_{60}Co_{40})_{80}$ film) and the magnetic layer 114 ($Tb_{20}(Fe_{50}Co_{50})_{80}$ film). With this condition, a magnetic field is vertically applied to the film surface of the magnetoresistive film. Then, the change in the voltage across the magnetoresistive film (i.e., magnetic field versus resistance curve) was measured for different directions and strengths of the magnetic field. The measurements showed that the magnetoresistance ratio is about 30%.

When the thus obtained magnetoresistive film was subjected to XPS (X-ray photoelectron spectroscopy), a peak value of $Gd_2O_3$ was observed near the interface between the ferrimagnetic layer 112 and the $Al_2O_3$ film which serves as the tunneling barrier layer 113. Thus, it was clear that Gd atoms were selectively oxidized near the interface.

Second Example

A magnetoresistive film was manufactured in the same manner as the first example except that the second example used a $Dy_{21}(Fe_{50}Co_{50})_{79}$ film having a film thickness of 10 nm as the ferrimagnetic layer 112 and a $Gd_{20}(Fe_{60}Co_{40})_{80}$ film having a film thickness of 10 nm as the magnetic layer 114. When the magnetic field versus resistance curve was measured, the magnetoresistance ratio was 29%. When the magnetoresistive film was subjected to the X-ray photoelectron spectroscopy (XPS), a peak value of $Dy_2O_3$ was observed near the interface of the ferrimagnetic layer 112 and the $Al_2O_3$ film that serves as the tunneling barrier layer 113. It was clear that the Dy atoms were selectively oxidized near the interface.

Third Example

A magnetoresistive film was manufactured by inserting $Fe_{60}Co_{40}$ in the interface between the ferrimagnetic layer 112 and the tunneling barrier layer 113 of the first example. This $Fe_{60}Co_{40}$ layer is not in the shape of a film that covers ferrimagnetic layer evenly but in the shape of an island. Each island has a diameter in the range of 1 to 2 nm. When the magnetic field versus resistance curve of this film was measured, it appeared that the $Fe_{60}Co_{40}$ that exists in the interface of the ferrimagnetic layer 112 and the tunneling barrier layer 113 is magnetized in a direction normal to the film surface due to an exchange coupling force interacting with the ferrimagnetic layer 112. The magnetoresistance ratio was about 50%. When the magnetoresistive film was subjected to the X-ray photoelectron spectroscopy (XPS), a peak value of $Gd_2O_3$ was observed near the interface between the ferrimagnetic layer 112 and $Fe_{60}Co_{40}$ layer. It was clear that the Gd atoms were selectively oxidized near the interface.

Fourth Example

Figure 3:
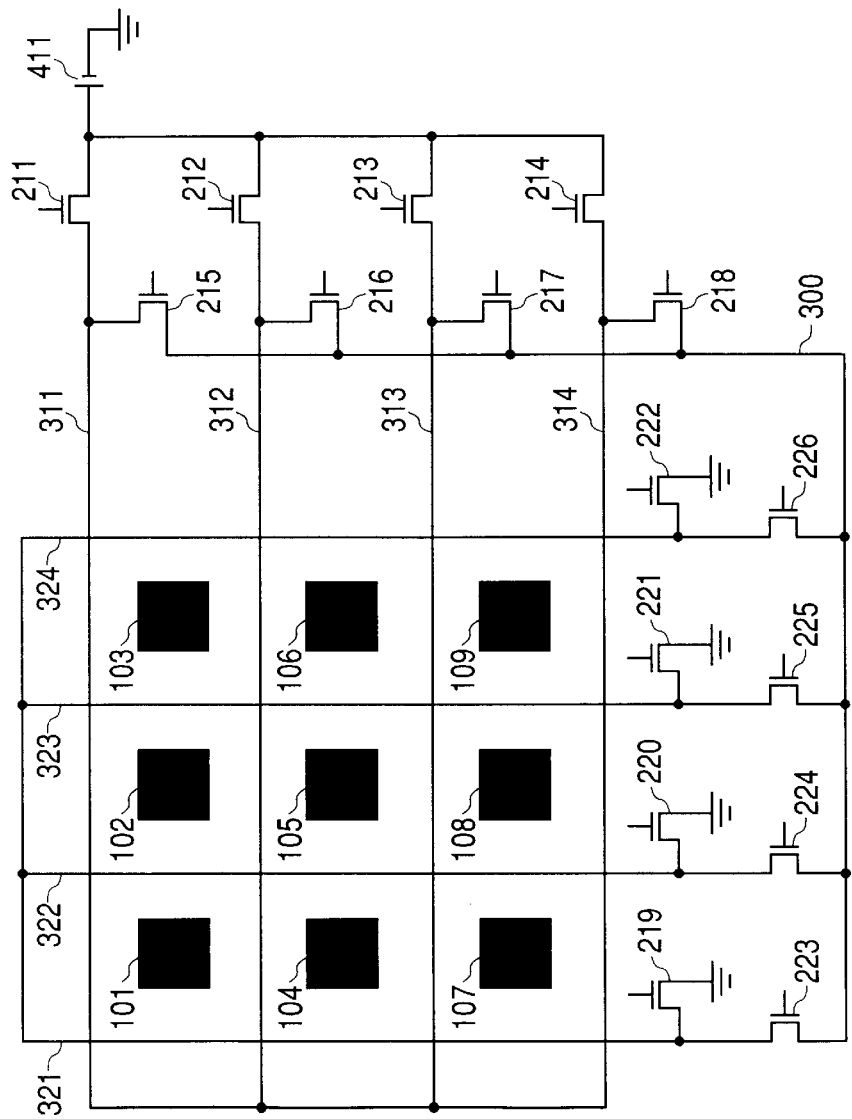
FIG. 3 is a schematic diagram, illustrating a circuit used in a fourth example, the circuit generating a magnetic field to be applied to the magnetoresistive film to write information therein.
Figure 4:
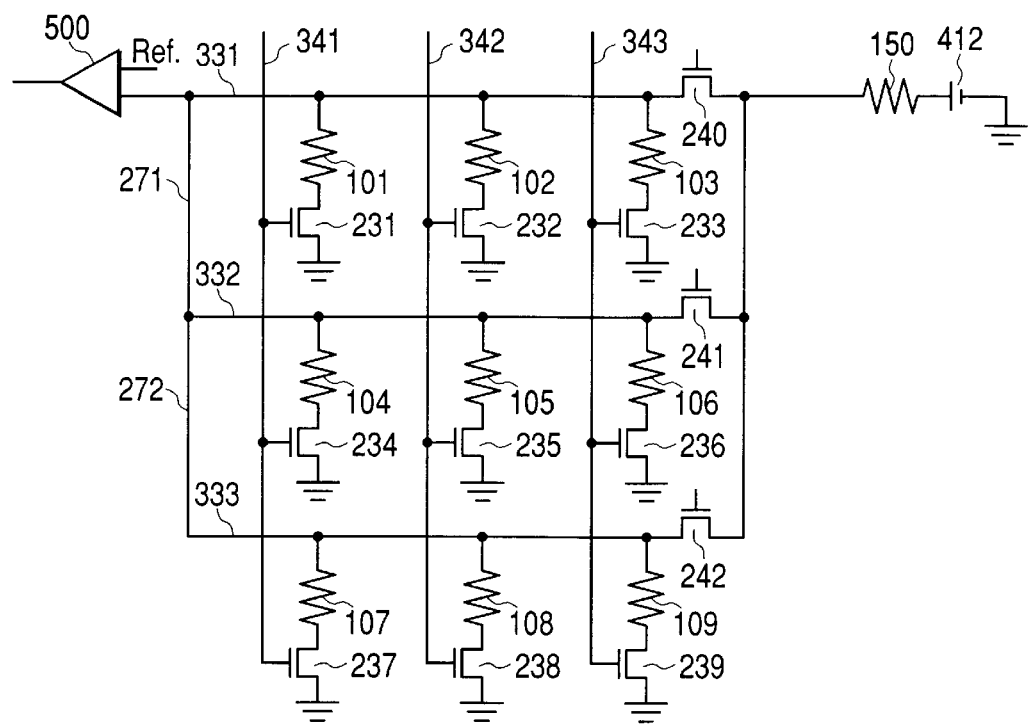
FIG. 4 is a schematic diagram, illustrating a circuit used in the fourth example, the circuit being used to read information from the magnetoresistive film.

After transistors and wiring layers were formed on an Si substrate (Si wafer), the magnetoresistive film according to the third example was formed. Then, the magnetoresistive film was formed into memory elements in a 3-by-3 matrix, i.e., nine memory elements to manufacture a memory cell array of MRAM. Information is written into the memory elements by running a current through the conducting wire to generate a magnetic field. FIG. 3 illustrates an electrical circuit that applies magnetic fields to the memory elements for recording information. FIG. 4 illustrates an electrical circuit for reading information from the memory elements. FIGS. 3 and 4 are top views of the Si substrate, illustrating the magnetoresistive film magnetized in a direction normal to the page. In practice, the circuits shown in FIGS. 3 and 4 are formed by a multi-layer wiring technique such that the circuit is superimposed on the memory cell array.

The technique for inverting the magnetization of the magnetic film of a selected memory element (magnetoresistive film) will be described.

As shown in FIG. 3, the memory cell array has nine memory elements (magnetoresistive film) 101 to 109 arranged in a 3-by-3 matrix in which first write lines 311 to 314 extend in a column direction so that each line of memory elements is sandwiched between the first write lines. The write lines 311 to 314 are connected together at their left ends and connected to transistors 211 to 214 that are connected to a power supply 411 and transistors 215 to 218 that are connected to a wire 300. Second write lines 321 to 324 extend in the direction of row so that each line of memory elements is sandwiched between the second write lines. The upper ends of these write lines 321 to 324 are connected together and the lower ends are connected to corresponding transistors 219 to 222 that serve to ground the write lines 321 to 324 and to corresponding transistors 223 to 226 that connect the write lines to the wire 300.

For example, when the magnetization of the magnetoresistive film 105 is to be inverted, the transistors 212, 217, 225 and 220 are conducted while the other transistors are turned off. Then, currents flow through the write lines 312, 313, 323, and 322 to generate magnetic fields around the write liens 312, 313, 323, and 322. With this condition, only the magnetoresistive film 105 receives magnetic fields in the same direction generated by the four write lines while the other magnetoresistive films receive magnetic fields in the same direction generated by only two write lines or magnetic fields of opposite directions that cancel out each other. As a result, the other magnetoresistive films do not receive as strong a magnetic field as the magnetoresistive film 105. Thus, if the resulting magnetic field applied by the four write lines in the same direction are slightly larger than a magnetic field inverting magnetization of the magnetic film of the memory element (magnetoresistive film), then only the magnetoresistive film 105 can be inverted in magnetization. If a magnetic field is to be applied to the magnetic film 105 in a vertical direction opposite to that in the aforementioned case, the transistors 213, 216, 224, and 221 are conducted while the other transistors are turned off. By operating the memory in this manner, currents flow through the write lines 312, 313, 323, and 322 in directions opposite to those in the aforementioned case, so that the magnetoresistive film 105 receives a resultant magnetic field opposite to the aforementioned case and the magnetoresistive film 105 holds one of two states of binary information opposite to the aforementioned case.

The reading operation will be described. As shown in FIG. 4, one ends 101 to 109 of the respective memory elements (magnetoresistive film) are connected in series with the transistors 231 to 239 that ground the one ends of the corresponding memory elements. Bit lines 331 to 333 are provided to each column. The right ends of the bit lines 331 to 333 are connected to transistors 240 to 242 that connect the bit lines 331 to 333 to a power supply 412 through a fixed resistor 150. The bit line 331 is connected to the other ends of the magnetoresistive films 101 to 103. The bit line 332 is connected to the other ends of the magnetoresistive films 104 to 106. The bit line 333 is connected to the other ends of the magnetoresistive films 107 to 109. The left ends of the bit lines 331 to 333 are connected together, the left ends being connected to a sense amplifier 500 that amplifies a difference between the potential of the bit lines and reference voltage Ref. Word lines 341 to 343 are provided to the corresponding rows. The word line 341 is connected to the gates of the transistors 231, 234, and 237. The word line 342 is connected to the gates of the transistors 232, 235, and 238. The word line 343 is connected to the gates of the transistors 233, 236, and 239.

Let's assume that, for example, information is read from the magnetoresistive film 105 and transistors 235 and 241 are conducted. Therefore, a power supply 412, the fixed resistor 150 and the magnetoresistive film 105 are connected in series. Thus, the supply voltage is divided by the ratio of the resistance of the fixed resistor 150 to the resistance of the magnetoresistive film 105. Because the supply voltage has a fixed value, when the electrical resistance of the magnetoresistive film changes, the voltage across the magnetoresistive film changes accordingly. The sense amplifier 500 reads this voltage, thereby enabling reading of the information from the magnetoresistive film 105.

Figure 5:
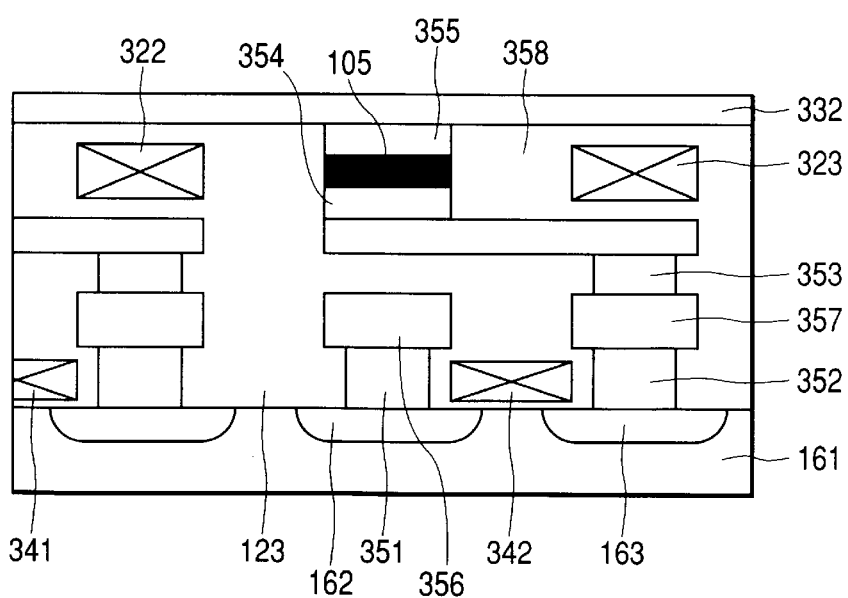
FIG. 5 is a cross-sectional view of a model representation of a memory element in the fourth example.
Figure 6A:
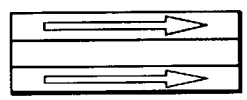
FIGS. 6A and 6B are cross-sectional views, illustrating the value of electrical resistance resulting from the magnetization direction and magnetoresistive effect of a magnetoresistive film.
Figure 6B:
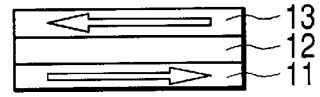
Figure 7A:
FIGS. 7A, 7B, 7C and 7D are cross-sectional views, illustrating the relationship between the magnetization direction and a read signal when a magnetoresistive film in the form of a vertically magnetizing film is used as a memory.
Figure 7B:
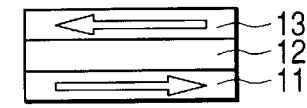
Figure 7C:
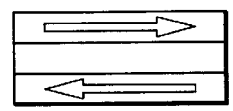
Figure 7D:
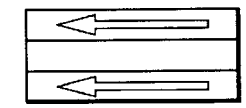
Figure 8A:
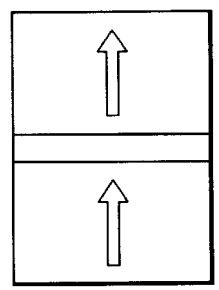
FIGS. 8A, 8B, 8C and 8D are cross-sectional views, illustrating the relationship between the magnetization direction and the read signal when a magnetoresistive film in the form of a vertically magnetizing film is used as a memory.
Figure 8B:
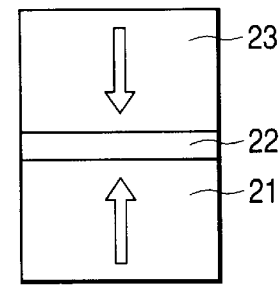
Figure 8C:
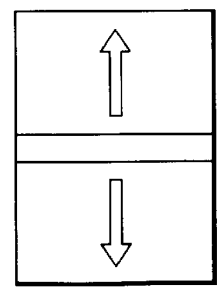
Figure 8D:
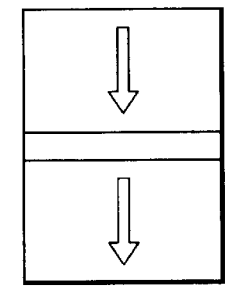

FIG. 5 shows a model representation of an actual structure of the periphery of the aforementioned one memory element. FIG. 5 shows a periphery of the magnetoresistive film 105 in FIGS. 3 and 4. For example, two n-type diffusion regions 162 and 163 are formed on a p-type Si substrate 161 and a word line (gate electrode) 342 is formed between the two n-type diffusion regions 162 and 163 with an insulation layer 123 formed therebetween. A ground line 356 is connected to the n-type diffusion region 162 through a contact plug 351. The magnetoresistive film 105 is connected to the n-type diffusion region 163 through contact plugs 352, 353, 354, and 357 and a local wire 358. The magnetoresistive film 105 is connected through a contact plugs 355 to a bit wire 332. Routed beside the magnetoresistive film 105 are write lines 322 and 323 that generate magnetic fields.

Comparative Example

Just as the first example, formed on the Si substrate 100 are a $Gd_{20}(Fe_{60}Co_{40})_{80}$ film having a film thickness of 10 nm that serves as a ferrimagnetic layer 112, and an $Al_2O_3$ film having a film thickness of 1.5 nm that serves as a tunneling barrier layer 113. Then, oxygen gas was introduced into the vacuum chamber so that plasma oxidation takes place through the surface of the tunneling barrier layer 113 ($Al_2O_3$ film). The power injected was 3 watts and oxidation lasted for 20 seconds. Thereafter, the chamber was evacuated sufficiently and sputtering was performed to form a $Tb_{20}(Fe_{50}Co_{50})_{80}$ film having a film thickness of 10 nm as a magnetic layer 114 and a Pt film having a film thickness of 2 nm as a protection layer 116 sequentially. Then, a resist film of 1 μm square was formed on the thus formed multi-layer film and the multi-layer film was subjected to dry etching to remove part of the magnetoresistive film that was not covered with the resist film. After the dry etching, an $Al_2O_3$ film having a film thickness of 25 nm was formed and then the resist film and the $Al_2O_3$ on the resist film were removed, thereby forming an insulation film 121 between the upper electrode and the ferrimagnetic layer 112 ($Gd_{20}(Fe_{60}Co_{40})_{80}$ film) for electrical insulation. Then, the upper electrode 122 in the form of an Al film was formed by a lift-off technique to remove part of the $Al_2O_3$ film that is not covered with the upper electrode.

A constant current source is connected across the upper electrical 122 and the lower electrode (Si substrate 100) of the thus formed magnetoresistive film, thereby running a predetermined current to allow electrons to tunnel between the ferrimagnetic layer 112 ($Gd_{20}(Fe_{60}Co_{40})_{80}$ film) and the magnetic layer 114 ($Tb_{20}(Fe_{50}Co_{50})_{80}$ film). With this condition, a magnetic filed was applied to the magnetoresistive film in the direction normal to the film surface of the magnetoresistive film, and changes (magnetoresistance curve) in the voltage across the magnetoresistive film were measured for different field strengths and directions of the magnetic field applied. The measurements showed a magnetoresistance ratio of about 6%.

When the magnetoresistive film was subjected to X-ray photoelectron spectroscopy (XPS), no peak value of $Gd_2O_3$ was observed near the interface between the ferrimagnetic layer 112 and the tunneling barrier layer 113. The Gd atoms in the vicinity of the interface are considered not to have been oxidized.

What is claimed is:

1. A magnetoresistive film comprising:
    a first magnetic layer and a second magnetic layer; and
    a tunneling barrier layer disposed between said first magnetic layer and said second magnetic layer;
    wherein at least one of said first magnetic layer and said second magnetic layer is a ferrimagnetic layer whose major composition comprises a rare earth metal and a transition metal; the magnetoresistive film including: oxidized rare earth metal present near an interface between said ferrimagnetic layer and said tunneling barrier layer.

2. The magnetoresistive film according to claim 1, wherein in said ferrimagnetic layer having a major composition comprising a rare earth metal and a transition metal, the rare earth metal being at least one of Gd, Dy or Tb and the transition metal being at least one of Fe, Co or Ni.

3. The magnetoresistive film according to claim 1, wherein said tunneling barrier layer is made of an aluminum oxide.

4. The magnetoresistive film according to claim 1, wherein a magnetization direction of said ferrimagnetic layer is perpendicular to a film plane.

5. The magnetoresistive film according to claim 1, wherein after said tunneling barrier layer is formed on a surface of said ferrimagnetic layer, said oxidized rare earth metal is formed by conducting an oxidizing step, from a surface of said tunneling barrier.

6. The magnetoresistive film according to claim 1, wherein after said ferrimagnetic layer is formed, an oxidizing step is performed on said ferrimagnetic layer, then said tunneling barrier layer is formed so that said rare earth metal near the interface is oxidized.

7. The magnetoresistive film according to claim 1, wherein a third magnetic layer is formed at the interface between said ferrimagnetic layer and said tunneling barrier layer, said third magnetic layer having a larger spin polarization than said ferrimagnetic layer.

8. The magnetoresistive film according to claim 7, wherein said third magnetic layer is in the shape of either an island or a net.

9. A method of manufacturing a magnetoresistive film, wherein the magnetoresistive film including:
    a first magnetic layer whose major compositions are a rare earth metal and a transition metal, the first magnetic layer being a ferrimagnetic layer;
    a second magnetic layer; and
    a tunneling barrier layer disposed between the first magnetic layer and the second magnetic layer;

wherein the method comprises the steps of:
forming the first magnetic layer;
forming the tunneling barrier layer on a surface of the first magnetic layer; and
performing an oxidizing step from a surface of the tunneling barrier layer so as to oxidize the rare earth metal in the first layer existing near the interface between the first magnetic layer and the tunneling barrier layer.

10. A method of manufacturing a magnetoresistive film, wherein the magnetoresistive film including:

a first magnetic layer whose major compositions are a rare earth metal and a transition metal, the first magnetic layer being a ferrimagnetic layer;

a second magnetic layer; and a tunneling barrier layer disposed between the first magnetic layer and the second magnetic layer;

wherein the method comprises the steps of:
forming the first magnetic layer;
performing an oxidation operation on a surface of the first magnetic layer; and
forming the tunneling barrier layer so as to oxidize the rare earth metal existing near an interface between the first magnetic layer and the tunneling barrier layer.

* * * * *